US008464126B2

(12) United States Patent
Kim et al.

(10) Patent No.: US 8,464,126 B2
(45) Date of Patent: Jun. 11, 2013

(54) HYBRID MESSAGE DECODERS FOR LDPC CODES

(75) Inventors: Young Gil Kim, Edmonton (CA); Norman C. Beaulieu, Edmonton (CA)

(73) Assignee: The Governors of the University of Alberta, Edmonton, Alberta (CA)

( * ) Notice: Subject to any disclaimer, the term of this patent is extended or adjusted under 35 U.S.C. 154(b) by 489 days.

(21) Appl. No.: 12/674,492

(22) PCT Filed: Aug. 19, 2008

(86) PCT No.: PCT/CA2008/001480
§ 371 (c)(1),
(2), (4) Date: Feb. 22, 2010

(87) PCT Pub. No.: WO2009/023962
PCT Pub. Date: Feb. 26, 2009

(65) Prior Publication Data
US 2011/0041032 A1    Feb. 17, 2011

Related U.S. Application Data

(60) Provisional application No. 60/957,036, filed on Aug. 21, 2007.

(51) Int. Cl.
*H03M 13/00* (2006.01)
(52) U.S. Cl.
USPC .......................................................... 714/758
(58) Field of Classification Search
USPC ............................................................ 714/758
See application file for complete search history.

(56) References Cited

U.S. PATENT DOCUMENTS

| | | | |
|---|---|---|---|
| 2004/0119616 A1* | 6/2004 | Han et al. | 341/50 |
| 2005/0204271 A1* | 9/2005 | Sharon et al. | 714/801 |
| 2006/0190797 A1* | 8/2006 | Xin | 714/758 |
| 2007/0143657 A1* | 6/2007 | Kanaoka et al. | 714/752 |
| 2007/0245217 A1* | 10/2007 | Valle | 714/758 |
| 2008/0040651 A1* | 2/2008 | Kanaoka et al. | 714/794 |

OTHER PUBLICATIONS

S. Lin and D.J. Costello, *Error Control Coding*. Prentice-Hall, 2nd Edition, 2004.
ETSI EN 302 307 V1.2.1 (Aug. 2009), Digital Video Broadcasting (DVB); *Second generation framing structure, channel coding and modulation systems for Broadcasting, Interactive Services, News Gathering and other broadband satellite applications (DVB-S2)*, Aug. 2009.
IEEE 802.11n-2009, *Part 11: Wireless LAN Medium Access Control (MAC) and Physical Layer (PHY) Specifications*, Oct. 29, 2009.
IEEE Std 802.3an-2006, *Part 3: Carrier Sense Multiple Access with Collision Detection (CSMA/CD) Access Method and Physical Layer Specifications*, Sep. 1, 2006.
IEEE 802.16/2009, *Part 16: Air Interface for Broadband Wireless Access Systems*, May 29, 2009.
T. Richardson and R. Urbanke, *Modem Coding Theory*. "http://lthcwww.epfl.ch/mct/index.php". Cambridge University Press, New York, 2008.

* cited by examiner

*Primary Examiner* — Yolanda L Wilson
(74) *Attorney, Agent, or Firm* — McDonnell Boehnen Hulbert & Berghoff LLP

(57) ABSTRACT

Two hybrid message decoders for low-density parity-check (LDPC) codes are proposed. One decoder uses a posteriori probability ratio (APPR) and a posteriori probability difference (APPD), and the other decoder uses a logarithm a posteriori probability ratio (LAPPR) and a logarithm a posteriori probability difference (LAPPD) as hybrid message. Since the variable node and check node processing can be readily done using APPR and APPD, respectively, the proposed decoders have lower complexity than the conventional decoder that uses LAPPR only as a message.

24 Claims, 12 Drawing Sheets

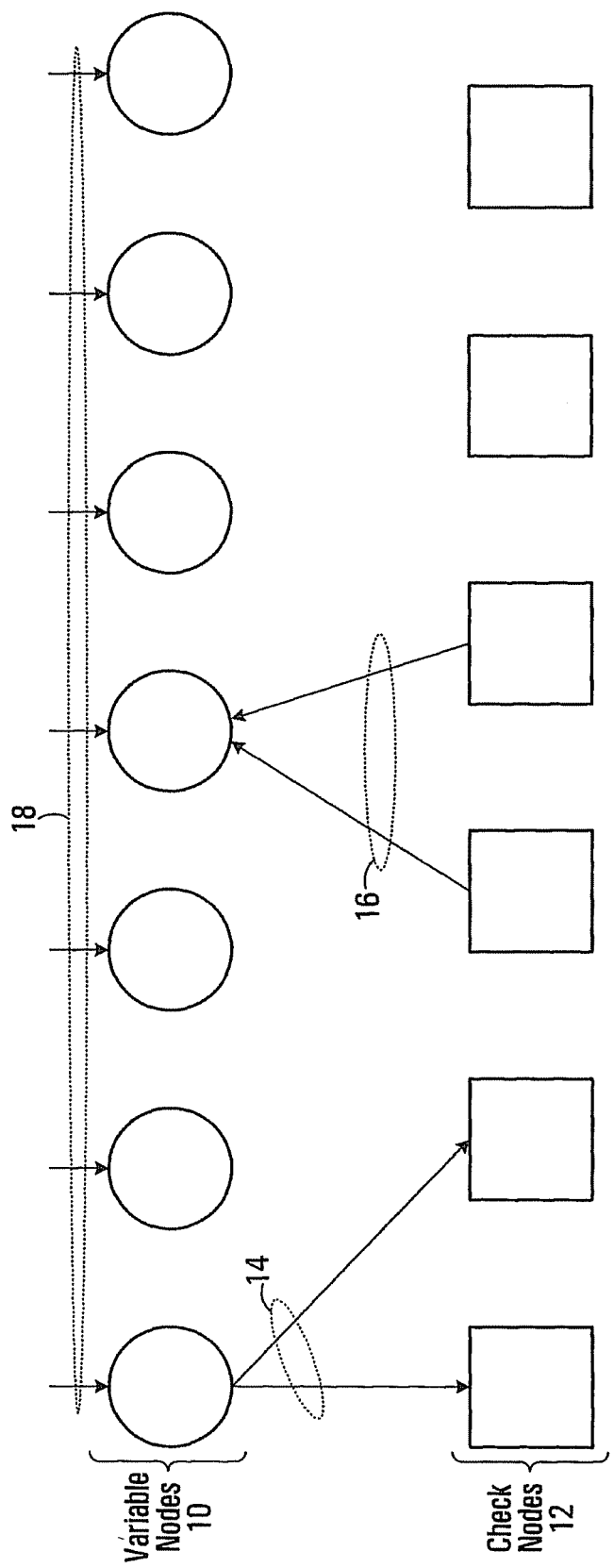

| Operation | Conventional LAPPR | APPR-APPD | LAPPR-LAPPD |
|---|---|---|---|
| Addition or Subtraction | $d_v$ | 2 | $d_v$ |
| Multiplication | 0 | $d_v$ | 0 |
| Division or Inverse | 0 | 1 | 0 |
| One Bit Shift | 0 | 1 | 0 |
| Table Look-up | 0 | 0 | 1 |

FIG. 8

| Operation | Conventional LAPPR | APPR-APPD | LAPPR-LAPPD |
|---|---|---|---|
| Addition or Subtraction | 0 | 2 | $d_c-1$ |
| Multiplication | $d_c-1$ | $d_c-1$ | 0 |
| Division or Inverse | 0 | 1 | 0 |
| One Bit Shift | 0 | 1 | 0 |
| Table Look-up | $d_c$ | 0 | 1 |

FIG. 9

HYBRID MESSAGE DECODERS FOR LDPC CODES

RELATED APPLICATION

This application claims the benefit of U.S. Provisional application No. 60/957,036 hereby incorporated by reference in its entirety.

FIELD OF THE INVENTION

The invention relates to LDPC (low-density parity-check) decoders.

BACKGROUND OF THE INVENTION

Low-density parity-check (LDPC) codes constitute a class of iteratively decoded error-control codes whose capacity-approaching performance and simple decoding have resulted in their inclusion in new communications standards such as DVB-S2, IEEE 802.11n, 802.3an, and 802.16. The basis of conventional LDPC codes are described in S. Lin and D. J. Costello, *Error Control Coding*. Prentice-Hall, 2nd Edition, 2004. The LDPC codes are iteratively decoded using a message-passing algorithm operating between variable and check nodes. The conventional decoder for binary LDPC codes uses the "logarithm a posteriori probability ratio" (LAPPR), which is the same as the log-likelihood ratio (LLR) when 1 and −1 are transmitted with equal probability 1/2, as a message. With this approach, the calculation of a hyperbolic tangent function is required at check nodes for the conventional LAPPR message. From the hardware implementation point of view, a look-up table to calculate a hyperbolic tangent function is needed.

An example structure of a decoder for sum-product decoding of LDPC codes is shown in FIG. 1. Shown are a set of variable nodes 10 and a set of check nodes 12. Arrows interconnecting the variable nodes and the check nodes represent message passing that takes place. An arrow 14 from a variable node 10 to a check node 12 represents a message generated by the variable node that is passed to the check node 12. An arrow 16 from a check node 12 to a variable node 10 represents a message generated by the check node 12 that is passed to the variable node 10. The set of variable nodes 10 passing messages to a given check node 12 are the neighbours of the check node 12. A variable node 10 of degree $d_v$ has $d_v$ neighbours. Similarly, the set of check nodes 12 passing messages to a given variable node 10 are the neighbours of that variable node 10. A check node 12 of degree $d_c$ has $d_c$ neighbours. Also shown is a set of intrinsic inputs 18 to the variable nodes 10 that are used to define an initial state of the decoder.

In a conventional LDPC decoder, the message output by a variable node v for a check node is referred to as a LAPPR $m_{v \to c}$ output message. The message output by a check node c is referred to as a LAPPR $m_{c \to v}$ output message.

The LAPPR $m_{v \to c}$ output message of a given variable node v is given by $$m_{v \to c} = m_0 + \sum_{h \in n_v - \{c\}} m_{h \to v} \qquad (1)$$

where $m_0$ is the intrinsic message for variable node v, $m_{h \to v}$ is the LAPPR message sent from check node h to variable node v, and $n_v - \{c\}$ represents the set of all the neighbors of node v in the graph that send check node messages to node v.

Thus, the LAPPR message at a variable node is the sum of the incoming LAPPR messages. For binary phase shift keying (BPSK) signaling over an additive white Gaussian noise (AWGN) channel, the intrinsic message $m_0$ is given by $$m_0 = \ln \frac{e^{-\frac{(r-1)^2}{2\sigma^2}}}{e^{-\frac{(r+1)^2}{2\sigma^2}}} = \frac{2r}{\sigma^2} \qquad (2)$$

where r is the matched filter output and $\sigma^2$ is the noise variance. If the variable node message is represented using APPR, (1) can be written as $$APPR_{v \to c} = APPR_0 \prod_{h \in n_v - \{c\}} APPR_{h \to v} \qquad (3)$$

where $APPR_0$ is equal to $e^{m_0}$.

The conventional LAPPR $m_{c \to v}$ output message of a given check node c is given by $$m_{c \to v} = 2 \tanh^{-1} \left( \prod_{y \in n_c - \{v\}} \tanh\left(\frac{m_{y \to c}}{2}\right) \right) \qquad (4)$$

where $n_c - \{v\}$ represents the set of all the neighbors of a node c in the graph that send variable node messages to node c.

It is shown in T. Richardson and R. Urbanke, *Modern Coding Theory*. "http://lthcwww.epfl.ch/mct/index.php that Eq. (4) can be written as $$\tanh\left(\frac{m_{c \to v}}{2}\right) = \prod_{y \in n_c - \{v\}} \tanh\left(\frac{m_{y \to c}}{2}\right). \qquad (5)$$

Assuming p and q are a posteriori probabilities, the LAPPR message m can be written as $$m = \ln \frac{p}{q} \qquad (6)$$

where p+q=1.

After some manipulation, it can be shown that $$\tanh\left(\frac{m}{2}\right) = \frac{e^m}{1+e^m} - \frac{1}{1+e^m} = p - q \qquad (7)$$

which will be referred to herein as "a posteriori probability difference", or APPD. Note that the following expressions all represent the same information:

APPD=$p-q$=tan $h(m/2)$;

LAPPD=(LAPPD$^{sgn}$,LAPPD$^{mag}$)=(sign(APPD), ln|APPD|);

APPR=$p/q$; and

LAPPR=$m$=ln $p/q$

By substituting the expression for APPD of equation (7) into equation (5), APPD-based check node computation becomes:

$$APPD_{c \to v} = \prod_{h \in n_c - \{v\}} APPD_{h \to c} \qquad (8)$$

Thus, the APPD as the output message of a check node is the product of the incoming APPD messages.

In conventional LDPC decoders, the messages that are passed back and forth between variable and check nodes are of the same form, namely all LAPPR, all APPR or all LAPPD.

SUMMARY OF THE INVENTION

According to one broad aspect, the invention provides an LDPC decoder comprising: a plurality of check nodes and a plurality of variable nodes; each of the check nodes functionally connected to receive a respective at least one APPR (a posteriori probability ratio) message from at least one variable node, each of the check nodes comprising processing circuitry that performs check node processing using the received at least one APPR message and outputs at a respective APPD (a posteriori probability difference) message to at least one variable node; each of the variable nodes functionally connected to receive a respective at least one APPD message from at least one check node and to receive an intrinsic input, each of the variable nodes comprising variable node processing circuitry that performs variable node processing using the received at least one APPD message and the intrinsic inputs and outputs a respective APPR message to at least one check node.

According to another broad aspect, the invention provides a receiver comprising: at least one antenna for receiving at least one input signal from which is generated a set of intrinsic inputs; at least one processor that performs LDPC decoding by: performing variable node processing for each of a plurality of variable nodes using APPR inputs and the intrinsic inputs to produce an APPD output; performing check node processing for each of a plurality of check nodes using APPD inputs to produce an APPR output; the APPD outputs of the variable nodes being used as APPD inputs of the check nodes, and the APPR outputs of the check nodes being used as APPR inputs of the variable nodes; repeating the performing variable node processing and performing variable node processing until a stop criterion is satisfied; outputting soft decisions or hard decisions.

According to another broad aspect, the invention provides a method of performing LDPC decoding comprising: receiving a set of intrinsic inputs; performing variable node processing for each of a plurality of variable nodes using APPR inputs and the intrinsic inputs to produce an APPD output; performing check node processing for each of a plurality of check nodes using APPD inputs to produce an APPR output; the APPD outputs of the variable nodes being used as APPD inputs of the check nodes, and the APPR outputs of the check nodes being used as APPR inputs of the variable nodes; repeating the performing variable node processing and performing variable node processing until a stop criterion is satisfied; making soft decisions or hard decisions.

According to another broad aspect, the invention provides a computer readable medium having computer executable instructions stored thereon which when executed on a computer implement a method comprising: performing variable node processing for each of a plurality of variable nodes using APPR inputs and a set of intrinsic inputs to produce an APPD output; performing check node processing for each of a plurality of check nodes using APPD inputs to produce an APPR output; the APPD outputs of the variable nodes being used as APPD inputs of the check nodes, and the APPR outputs of the check nodes being used as APPR inputs of the variable nodes; repeating the performing variable node processing and performing variable node processing until a stop criterion is satisfied; making soft decisions or hard decisions.

According to another broad aspect, the invention provides a LDPC decoder comprising: a plurality of check nodes and a plurality of variable nodes; each of the check nodes functionally connected to receive a respective at least one LAPPR (logarithm a posteriori probability ratio) message from at least one variable node, each of the check nodes comprising processing circuitry that performs check node processing using the received at least one LAPPR message and outputs at a respective LAPPD (logarithm a posteriori probability difference) message to at least one variable node; each of the variable nodes functionally connected to receive a respective at least one LAPPD message from at least one check node and to receive an intrinsic input, each of the variable nodes comprising variable node processing circuitry that performs variable node processing using the received at least one LAPPD message and the intrinsic inputs and outputs a respective LAPPR message to at least one check node.

According to another broad aspect, the invention provides a receiver comprising: at least one antenna for receiving at least one input signal from which is generated a set of intrinsic inputs; at least one processor that performs LDPC decoding by: performing variable node processing for each of a plurality of variable nodes using LAPPR inputs and the intrinsic inputs to produce an LAPPD output; performing check node processing for each of a plurality of check nodes using LAPPD inputs to produce an LAPPR output; the LAPPD outputs of the variable nodes being used as LAPPD inputs of the check nodes, and the LAPPR outputs of the check nodes being used as LAPPR inputs of the variable nodes; repeating the performing variable node processing and performing variable node processing until a stop criterion is satisfied; outputting soft decisions or hard decisions.

According to another broad aspect, the invention provides a method of performing LDPC decoding comprising: receiving a set of intrinsic inputs; performing variable node processing for each of a plurality of variable nodes using LAPPR inputs and the intrinsic inputs to produce an LAPPD output; performing check node processing for each of a plurality of check nodes using LAPPD inputs to produce an LAPPR output; the LAPPD outputs of the variable nodes being used as LAPPD inputs of the check nodes, and the LAPPR outputs of the check nodes being used as LAPPR inputs of the variable nodes; repeating the performing variable node processing and performing variable node processing until a stop criterion is satisfied; outputting soft decisions or hard decisions.

According to another broad aspect, the invention provides a computer readable medium having computer executable instructions stored thereon which when executed on a computer implement a method comprising: performing variable node processing for each of a plurality of variable nodes using LAPPR inputs and a set of intrinsic inputs to produce an LAPPD output; performing check node processing for each of a plurality of check nodes using LAPPD inputs to produce an LAPPR output; the LAPPD outputs of the variable nodes being used as LAPPD inputs of the check nodes, and the LAPPR outputs of the check nodes being used as LAPPR inputs of the variable nodes; repeating the performing variable node processing and performing variable node processing until a stop criterion is satisfied; outputting soft decisions or hard decisions.

According to another broad aspect, the invention provides a method/circuit/LDPC decoder/computer readable medium operable to implement a method comprising: performing check node processing based on input messages of a first type to output messages of a second type; performing variable node processing based on input messages of the second type to output messages of the first type; the output messages of the variable nodes being used as input messages of the check nodes, and the output messages of the check nodes being used as input messages of the variable nodes.

BRIEF DESCRIPTION OF THE DRAWINGS

FIG. 1 is a schematic diagram of an LDPC decoder;
FIGS. 8 and 9 show comparisons of the number of computations in a variable node and the check node respectively for conventional LAPPR decoders, and for APPR-APPD decoders and for LAPPR-LAPPD decoders.

DETAILED DESCRIPTION OF EMBODIMENTS

Two hybrid message decoders for LDPC codes are provided. Since the a posteriori probability ratio (APPR), a posteriori probability difference (APPD), logarithm a posteriori probability ratio (LAPPR), and logarithm a posteriori probability difference (LAPPD) can be used to convey the same information, LDPC decoding can be performed using any of these four message types.

At variable nodes, the APPR is selected as an appropriate incoming message since the output APPR of a variable node is a product of the input APPR messages. At check nodes, the APPD is selected as an appropriate incoming message since the output APPD of a check node is a product of the input APPD messages. A decoder that operates using APPR and APPD messages, referred to herein as a hybrid APPR-APPD message decoder is detailed below. For the APPR-APPD hybrid message decoder, the APPR is used as the input message of variable nodes and the APPD is used as the input message of check nodes.

In some embodiments, a logarithmic transformation is used to change the product operation to a summation operation, such that a {LAPPR,LAPPD} hybrid messaging is used instead of the {APPR,APPD} hybrid messaging. A decoder that operates using LAPPR and LAPPD messages, referred to below as a hybrid LAPPR-LAPPD message decoder is detailed below. For the LAPPR-LAPPD hybrid message decoder, the LAPPR is used as the input message of variable nodes and the LAPPD is used as the input message of check nodes.

APPR-APPD Hybrid Message Decoder

Figure 6:
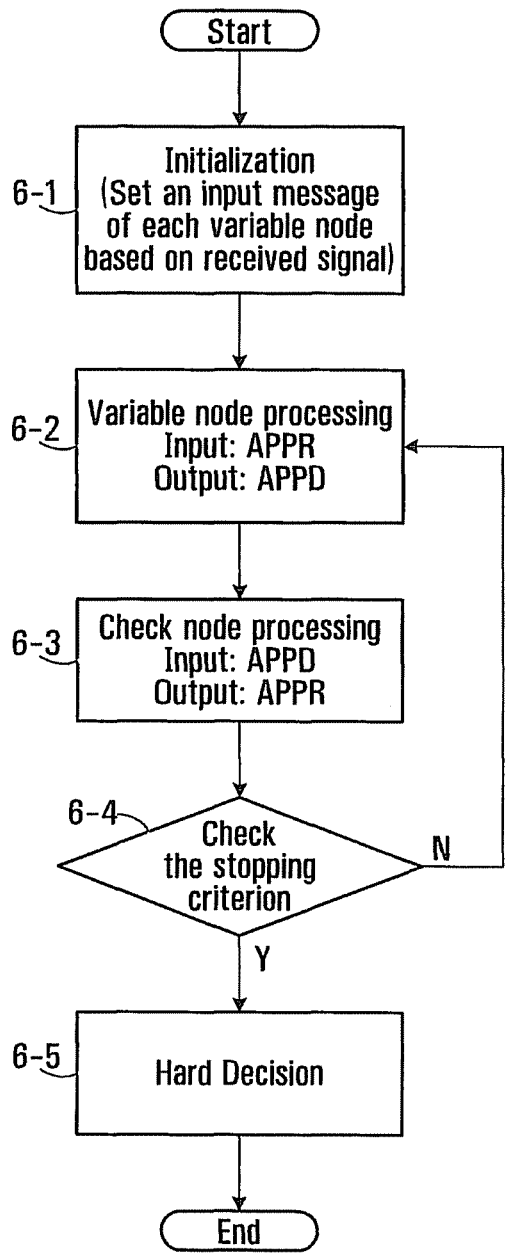
FIG. 6 is a flow chart of a method of processing in a APPR-APPD LDPC decoder.

An APPR-APPD hybrid message decoder that uses APPR as the input message of variable nodes and APPD as the input message of check nodes will now be described. The APPR at a variable node is the product of the incoming APPRs, and the APPD at a check node is the product of the incoming APPDs. Thus, a simple implementation of sum-product decoding can be realized by using the APPR and the APPD as the input message of variable nodes and check nodes, respectively. Referring now to FIG. 6, shown is a flowchart realization of an APPR-APPD hybrid message decoder. The method starts at step 6-1 with initialization in which the intrinsic message is set for each variable node. This may be preceded by the reception of a signal over a physical communications medium such as a wireless channel, twisted pair, coaxial cable, optical fiber channel to name a few specific examples. In step 6-2, each variable node performs variable node processing using APPR inputs to produce an APPD output. In step 6-3, each check node performs check node processing using APPD inputs to produce an APPR output. At step 6-4, a stop criterion is checked. Any appropriate stop criterion can be employed. The stop criterion might, for example, be a maximum number of iterations. There are many early stopping criteria based on LAPPR values or change rate of LAPPR values of variable nodes. In the event the stop criterion is not satisfied, then the method continues back at step 6-2, and steps 6-2,6-3,6-4 are iterated until the stop criterion is satisfied. After the stop criterion is satisfied, a hard decision is made at step 6-5. Hard decisions might for example be made based on whether or not the APPRs of the variable nodes are greater than one or not. While typically a hard decision is made, as described above, in some embodiments soft decisions may be provided. This might be employed, for example, in a concatenated coding system.

Variable Node Processing

The variable node receives APPR messages, and determines an output APPR using equation (3) above. The APPD p–q is equal to $$1 - \frac{2}{1 + APPR}.$$

This can be used in the variable node to convert the APPR determined as the product of incoming APPRs into the APPD form expected by the check nodes. More specifically, from (3), the $APPD_{v \to c}$ as the output message of a variable node v is given by $$APPD_{v \to c} = 1 - 2\left(1 + APPR_0 \prod_{h \in n_v - \{c\}} APPR_{h \to v}\right)^{-1} \quad (9)$$

where $APPR_0 = e^{m_0}$. This is the output message that is then passed to the check nodes.

Figure 2A:
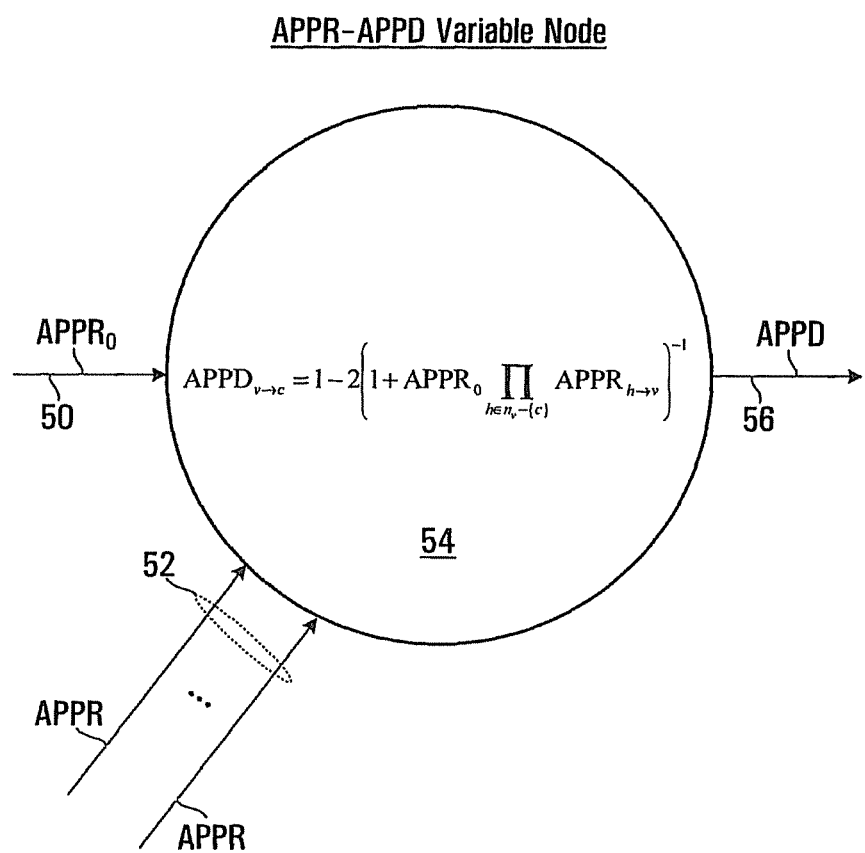
FIG. 2A is a block diagram of a variable node of an APPR-APPD LDPC decoder.

FIG. 2A is a block diagram of an APPR-APPD variable node. The variable node receives the intrinsic input $APPR_0$ 50 and receives the APPR messages collectively indicated at 52 from the check nodes and outputs APPD message 56 after implementing variable node processing 54.

Figure 2B:
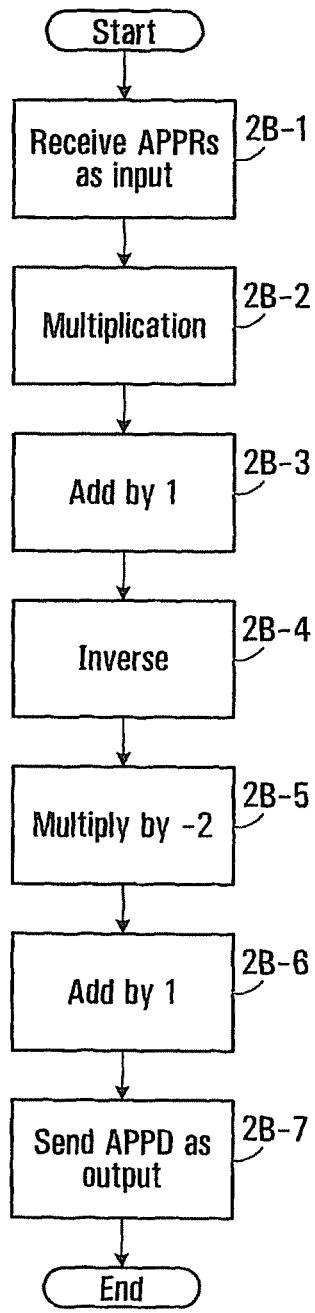
FIG. 2B is a flow chart of an example method of operation of the variable node for an APPR-APPD LDPC decoder.

FIG. 2B is a flowchart of an example method of operation of the APPR-APPD variable node. The method begins at block 2B-1 with the receipt of the APPR messages as input. These are multiplied together at block 2B-2. In block 2B-3, the multiplied amount is increased by one. In block 2B-4, the inverse is taken. In block 2B-5, the result is multiplied by "−2". In block 2B-6, the amount is increased by one. In block 2B-7, the APPD thus generated is output.

Check Node Processing

The check node receives APPD messages, and determines the output APPD using equation (8) above. The APPR is then determined according to $$\frac{2}{1-APPD} - 1.$$

This can be used to convert the APPD into the APPR form expected by the variable node. From (4), the $APPR_{c \to v}$ as the output message of a check node c is given by $$APPR_{c \to v} = 2\left(1 - \prod_{y \in n_c - \{v\}} APPD_{y \to c}\right)^{-1} - 1. \quad (10)$$

Figure 3A:
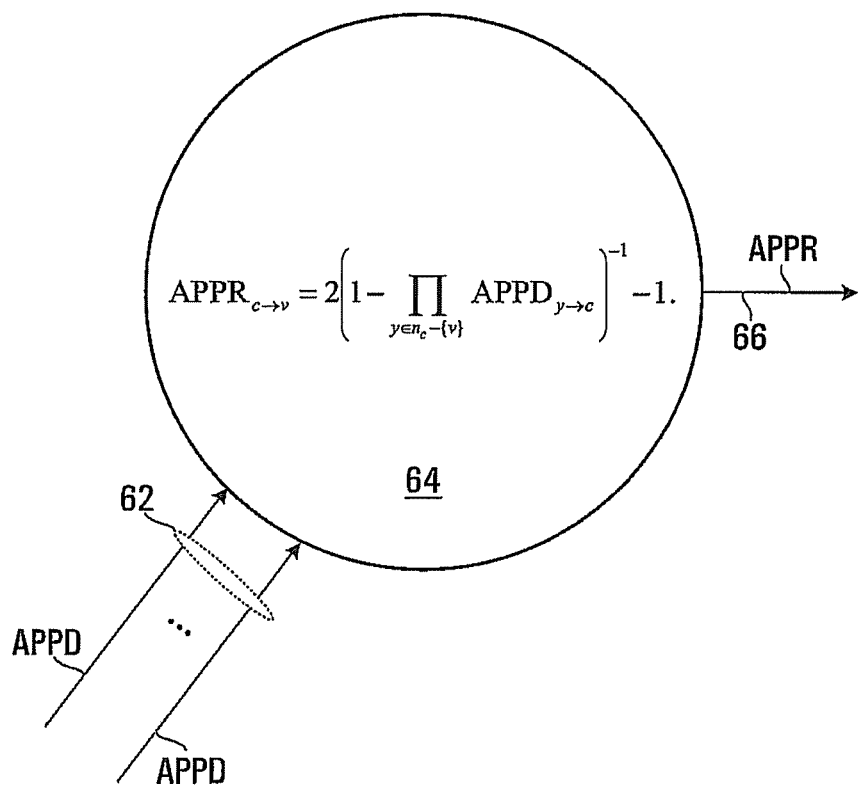
FIG. 3A is a block diagram of a check node for an APPD-APPR LDPC decoder.

FIG. 3A is a block diagram of an APPR-APPD check node. The check node receives the APPD messages collectively indicated at 62 from the variable nodes and outputs APPR message 66 after implementing check node processing 64.

Figure 3B:
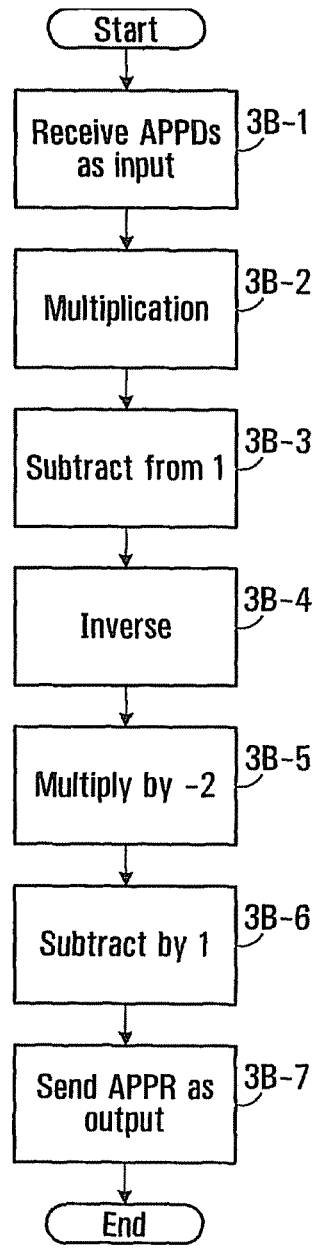
FIG. 3B is a flow chart of an example method of operation of a check node in a APPD-APPR LDPC decoder.

FIG. 3B is a flowchart of an example method of operation of the APPR-APPD check node. The method begins at block 3B-1 with the receipt of the APPD messages as input. These are multiplied together at block 3B-2. In block 3B-3, one is subtracted from the multiplied amount. In block 3B-4, the inverse is taken. In block 3B-5, the result is multiplied by "−2". In block 3B-6, the amount is decreased by one. In block 3B-7, the APPR thus generated is output.

LAPPR-LAPPD Hybrid Message Decoder

A LAPPR-LAPPD hybrid message decoder that uses LAPPR as the input message of variable nodes and LAPPD as the input message of check nodes is provided. Using the LAPPR-LAPPD hybrid message, the product operation of the APPR-APPD hybrid message decoder is changed to the summation operation.

Figure 7:
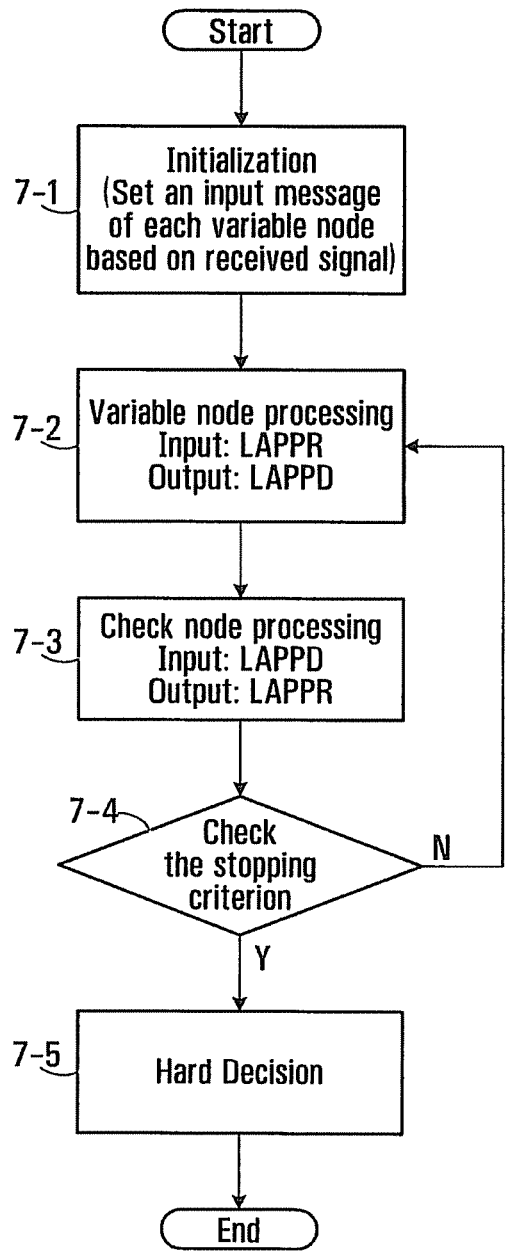
FIG. 7 is a flow chart of a method of processing in a LAPPR-LAPPD LDPC decoder.

Referring now to FIG. 7, shown is a flowchart realization of an APPR-APPD hybrid message decoder. The method starts at step 7-1 with initialization in which the intrinsic message is set for each variable node. This may be preceded by the reception of a signal over a physical communications medium such as a wireless channel. In step 7-2, each variable node performs variable node processing using LAPPR inputs to produce an LAPPD output. In step 7-3, each check node performs check node processing using LAPPD inputs to produce an LAPPR output. At step 7-4, a stop criterion is checked. In the event the stop criterion is not satisfied, then the method continues back at step 7-2, and steps 7-2, 7-3, 7-4 are iterated until the stop criterion is satisfied. After the stop criterion is satisfied, a hard decision is made at step 7-5. Hard decisions might for example be made based on the signs of the LAPPRs of the variable nodes.

Variable Node Processing

The variable node receives LAPPR messages, and determines an output LAPPR using equation (1) above. The LAPPD=(sign(p−q), ln|p−q|) is equal to $$\left(\text{sign}\left(\tanh\left(\frac{m}{2}\right)\right),\right.$$

$$\left.\ln\left|\tanh\left(\frac{m}{2}\right)\right|\right).$$

This can be used to convert the LAPPR message into the LAPPD form expected by the check node. More specifically, the $LAPPD_{v \to c}$ as the output message of a variable node v is given by $$LAPPD_{v \to c}^{sgn} = \text{sign}\left(\tanh\left(\frac{m_0 + \sum_{h \in n_v - \{c\}} m_{h \to v}}{2}\right)\right) \quad (11)$$

$$LAPPD_{v \to c}^{mag} = \ln\left|\tanh\left(\frac{m_0 + \sum_{h \in n_v - \{c\}} m_{h \to v}}{2}\right)\right|.$$

where the intrinsic input, and $m_{h \to v}$ are the LAPPR input messages.

Figure 4A:
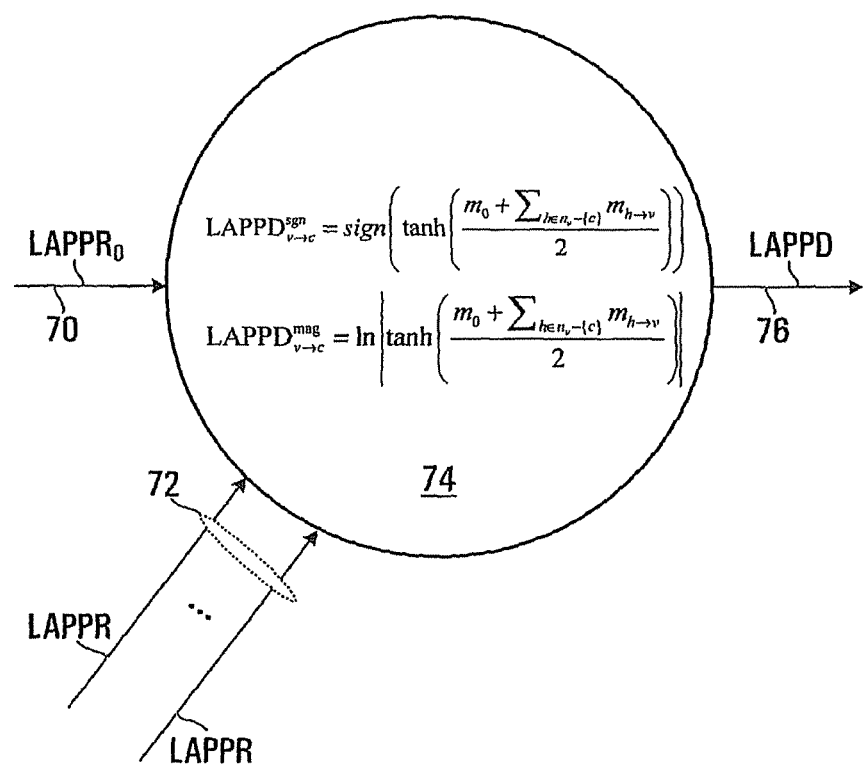
FIG. 4A is a block diagram of a variable node of an LAPPR-LAPPD LDPC decoder.

FIG. 4A is a block diagram of an LAPPR-LAPPD variable node. The variable node receives the intrinsic input $LAPPR_0$ 70 and receives the LAPPR messages collectively indicated at 72 from the check nodes and outputs LAPPD message 76 after implementing variable node processing 74.

Figure 4B:
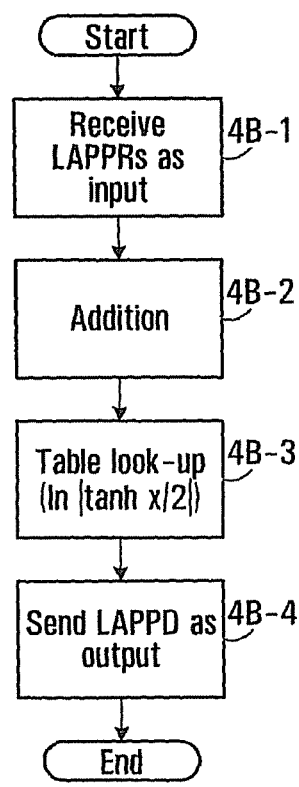
FIG. 4B is a flow chart of an example method of operation of the variable node for an LAPPR-LAPPD LDPC decoder.

FIG. 4B is a flowchart of an example implementation of the LAPPR-LAPPD variable node. At block 4B-1, the LAPPR inputs are received from the check nodes. At block 4B-2, the received LAPPR inputs are summed together. At block 4B-3, the magnitude and sign of the LAPPD message are determined using equation (11). This might for example be implemented using a table lookup operation. At block 4B-4, the LAPPD message is output.

Check Node Processing

The check node receives LAPPD messages, and determines an output LAPPD using a logarithmic form of equation (8) above.

The LAPPR m is equal to $2 \tan h^{-1} \exp(LAPPD)$. This can be used to convert the LAPPD message into the LAPPR form expected by the variable node. More specifically, substituting in a logarithmic form of equation (8), the LAPPR $m_{c \to v}$ as the output message of a check node c is given by $$m_{c \to v} = \prod_{y \in n_c - \{v\}} LAPPD_{y \to c}^{sgn} \cdot 2\tanh^{-1}\exp\left(\sum_{y \in n_c - \{v\}} LAPPD_{y \to c}^{mag}\right). \quad (12)$$

Figure 5A:
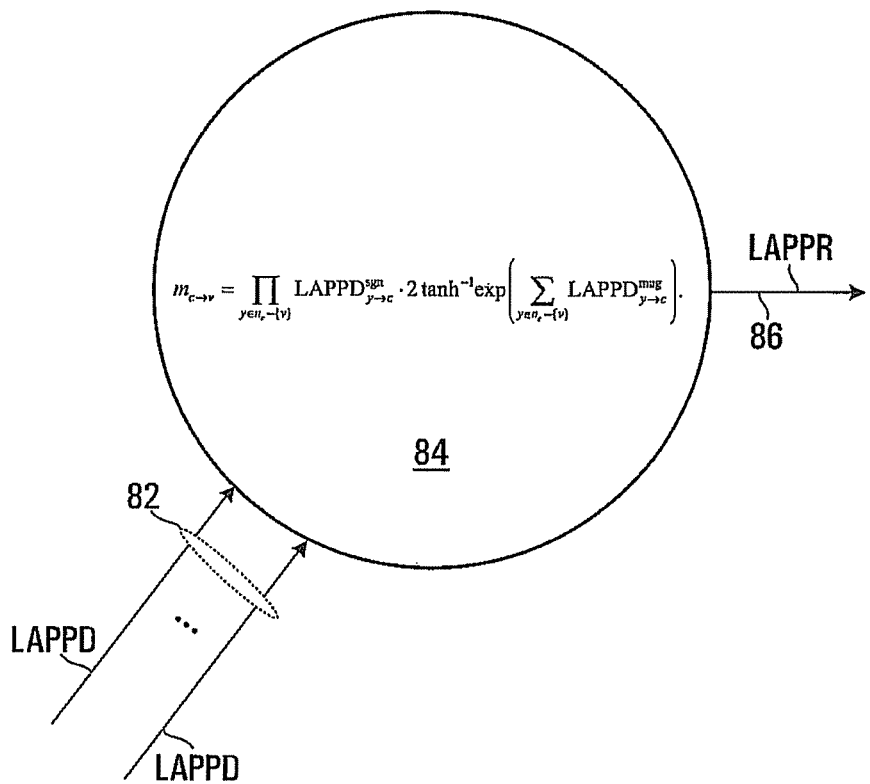
FIG. 5A is a block diagram of a check node for an LAPPD-LAPPR LDPC decoder.

FIG. 5A is a block diagram of an LAPPR-LAPPD variable node. The check node receives the LAPPD messages collectively indicated at 82 from the variable nodes and outputs LAPPR message 86 after implementing check node processing 84.

Figure 5B:
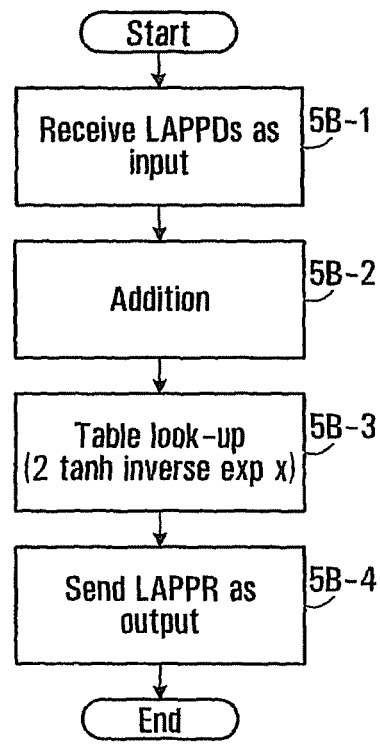
FIG. 5b is a flow chart of an example method of operation of a check node in a LAPPD-LAPPR LDPC decoder.

FIG. 5B is a flowchart of an example implementation of the LAPPR-LAPPD check node. At block 5B-1, the LAPPD inputs are received from the variable nodes. At block 5B-2, the received LAPPD inputs are summed together. At block 58-3, the magnitude and sign of the LAPPR message are determined using equation (12). This might for example be implemented using a table lookup operation. At block 5B-4, the LAPPD message is output.

Embodiments of the application provide LDPC decoders that are made of the above-described check and variable nodes, and methods that perform LDPC decoding using such nodes. In some embodiments, the intrinsic inputs are received over a physical communications medium. In some embodiments, the intrinsic inputs are a set of sequential samples of a received signal. In another embodiment, the intrinsic inputs are a set of parallel samples, for example, a set of samples allocated to different subcarriers in the frequency domain of an OFDM signal. Typically, the physical communications medium is one that introduces some distortion into the signals it conveys. Some embodiments feature one or more circuit elements for converting inputs received over a physical communications medium into digitized values for processing by the variable nodes. Specific examples include receiver front end or RF chains, matched filters, circuits for synchronization. In some embodiments, the variable nodes and the check nodes are physically distinct processing elements interconnected with physical communications links, for example circuit board traces. In some embodiments, the physically distinct processing elements are implemented on a common chip, while in other embodiments, they are implemented on separate chips.

In some embodiments, the LDPC decoder is implemented as part of a receiver that has at least one antenna for receiving signals over a wireless channel. The incoming signal is converted to the intrinsic inputs of the LDPC decoder.

The LDPC decoder functionality per se in some embodiments is implemented using circuits. For example, a first circuit can be used for each variable node, and a second circuit for each check node, with physical interconnections between the nodes for message passing. In another embodiment, a processor is equipped with appropriate instructions to implement the method in which case the "nodes" are logical entities within the software. Another embodiment provides a computer readable medium having instructions stored thereon which, when executed on an appropriate processing platform such as a computer, will cause one or more of the methods described herein to be performed.

Computational Complexity

In FIGS. 8 and 9, the number of computations at the variable node and the check node are presented. Here, it is assumed that $$\tanh\left(\frac{1}{2}\cdot\right), 2\tanh^{-1}(\cdot), \ln\tanh\left(\frac{1}{2}\cdot\right), 2\tanh^{-1}\exp(\cdot)$$

functions are implemented using a table look-up. In the APPR-APPD hybrid message decoder, the only required operations are addition, subtraction, multiplication, and division. Compared with the conventional decoder, the LAPPR-LAPPD hybrid message decoder is shown to decrease the number of table look-up operations for an output message of a check node from $d_c$ to one, while it increases by only one table look-up operation for an output message of a variable node.

Two specific examples of check node and variable node processing have been provided in which check node processing is performed based on input messages of a first type, and variable node processing is based on input messages of a second type. Another embodiment provide a generalization of this approach in which check node processing is performed based on input messages of a first type to output messages of a second type, and variable node processing is performed based on input messages of the second type to output messages of the first type. The output messages of the variable nodes are used as input messages of the check nodes, and the output messages of the check nodes are used as input messages of the variable nodes. Further embodiments provide a computer readable medium, circuit, LDPC decoder based on this generalization.

Numerous modifications and variations of the present invention are possible in light of the above teachings. It is therefore to be understood that within the scope of the appended claims, the invention may be practiced otherwise than as specifically described herein.

We claim:

1. An LDPC (low density parity check) decoder comprising:
a plurality of check nodes and a plurality of variable nodes;
each of the check nodes functionally connected to receive a respective at least one APPR (a posteriori probability ratio) message from at least one variable node, each of the check nodes comprising processing circuitry that performs check node processing using the received at least one APPR message and outputs at a respective APPD (a posteriori probability difference) message to at least one variable node;
each of the variable nodes functionally connected to receive a respective at least one APPD message from at least one check node and to receive an intrinsic input, each of the variable nodes comprising variable node processing circuitry that performs variable node processing using the received at least one APPD message and the intrinsic inputs and outputs a respective APPR message to at least one check node;
wherein the LDPC decoder is implemented using at least one of:
a first circuit for each variable node and a second circuit for each check node with physical interconnections between the nodes for message passing;
a processor with instructions to implement the functionality of the check nodes and the variable nodes.

2. The decoder of claim 1 further comprising:
a signal converter for receiving a signal over a physical communications medium and generating the intrinsic inputs.

3. The decoder of claim 1 wherein:
the check nodes are physically distinct from the variable nodes, the decoder further comprising at least one physical communications link for passing messages between the check nodes and the variable nodes.

4. The decoder of claim 1 wherein:
variable node processing is performed according to:

$$APPD_{v\to c} = 1 - 2\left(1 + APPR_0 \prod_{h \in n_v - \{c\}} APPR_{h\to v}\right)^{-1} \quad (9)$$

where:
$APPD_{v\to c}$ is the output of a given variable node;
$APPR_0$ is an intrinsic input to a given variable node;
$APPR_{h\to v}$, $h \in n_v - \{c\}$ are the messages received by the given variable node;
check node processing is performed according to:

$$APPR_{c\to v} = 2\left(1 - \prod_{y \in n_c - \{v\}} APPD_{y\to c}\right)^{-1} - 1. \quad (10)$$

where:
$APPR_{c\to v}$ is the output of a given check node;
$APPD_{y\to c}$, $y \in n_c - \{v\}$ are the messages received by the given check node.

5. A receiver comprising:
at least one antenna for receiving at least one input signal from which is generated a set of intrinsic inputs;
at least one processor that performs LDPC decoding by:
performing variable node processing for each of a plurality of variable nodes using APPR inputs and the intrinsic inputs to produce an APPD output;
performing check node processing for each of a plurality of check nodes using APPD inputs to produce an APPR output;
the APPD outputs of the variable nodes being used as APPD inputs of the check nodes, and the APPR outputs of the check nodes being used as APPR inputs of the variable nodes;
repeating the performing variable node processing and performing check node processing until a stop criterion is satisfied;
outputting soft decisions or hard decisions.

6. The receiver of claim 5 wherein outputting soft decisions or hard decisions comprises outputting hard decisions.

7. The receiver of claim 5 wherein:
variable node processing is performed according to:

$$APPD_{v \to c} = 1 - 2\left(1 + APPR_0 \prod_{h \in n_v - \{c\}} APPR_{h \to v}\right)^{-1} \quad (9)$$

where:
$APPD_{v \to c}$ is the output of a given variable node;
$APPR_0$ is an intrinsic input to a given variable node;
$APPR_{h \to v}$, $h \in n_v - \{c\}$ are the messages received by the given variable node;
check node processing is performed according to:

$$APPR_{c \to v} = 2\left(1 - \prod_{y \in n_c - \{v\}} APPD_{y \to c}\right)^{-1} - 1. \quad (10)$$

where:
$APPR_{c \to v}$ is the output of a given check node;
$APPD_{y \to c}$, $y \in n_c - \{v\}$ are the messages received by the given check node.

8. A method of performing LDPC decoding comprising:
receiving a set of intrinsic inputs;
performing variable node processing for each of a plurality of variable nodes using APPR inputs and the intrinsic inputs to produce an APPD output;
performing check node processing for each of a plurality of check nodes using APPD inputs to produce an APPR output;
the APPD outputs of the variable nodes being used as APPD inputs of the check nodes, and the APPR outputs of the check nodes being used as APPR inputs of the variable nodes;
repeating the performing variable node processing and performing check node processing until a stop criterion is satisfied;
outputting soft decisions or hard decisions.

9. The method of claim 8 wherein outputting soft decisions or hard decisions comprises outputting hard decisions.

10. The method of claim 8 wherein:
variable node processing is performed according to:

$$APPD_{v \to c} = 1 - 2\left(1 + APPR_0 \prod_{h \in n_v - \{c\}} APPR_{h \to v}\right)^{-1} \quad (9)$$

where:
$APPD_{v \to c}$ is the output of a given variable node;
$APPR_0$ is an intrinsic input to a given variable node;
$APPR_{h \to v}$, $h \in n_v - \{c\}$ are the messages received by the given variable node;
check node processing is performed according to:

$$APPR_{c \to v} = 2\left(1 - \prod_{y \in n_c - \{v\}} APPD_{y \to c}\right)^{-1} - 1. \quad (10)$$

where:
$APPR_{c \to v}$ is the output of a given check node;
$APPD_{y \to c}$, $y \in n_c - \{v\}$ are the messages received by the given check node.

11. The method of claim 8 wherein receiving a set of intrinsic inputs comprises:
receiving a signal over a physical communications medium and generating the intrinsic inputs from the signal.

12. A non-transitory computer readable medium having computer executable instructions stored thereon which when executed on a computer implement a method comprising:
performing variable node processing for each of a plurality of variable nodes using APPR inputs and a set of intrinsic inputs to produce an APPD output;
performing check node processing for each of a plurality of check nodes using APPD inputs to produce an APPR output;
the APPD outputs of the variable nodes being used as APPD inputs of the check nodes, and the APPR outputs of the check nodes being used as APPR inputs of the variable nodes;
repeating the performing variable node processing and performing check node processing until a stop criterion is satisfied;
making hard or soft decisions.

13. The computer readable medium of claim 12 wherein:
variable node processing is performed according to:

$$APPD_{v \to c} = 1 - 2\left(1 + APPR_0 \prod_{h \in n_v - \{c\}} APPR_{h \to v}\right)^{-1} \quad (9)$$

where:
$APPD_{v \to c}$ is the output of a given variable node;
$APPR_0$ is an intrinsic input to a given variable node;
$APPR_{h \to v}$, $h \in n_v - \{c\}$ are the messages received by the given variable node;
check node processing is performed according to:

$$APPR_{c \to v} = 2\left(1 - \prod_{y \in n_c - \{v\}} APPD_{y \to c}\right)^{-1} - 1. \quad (10)$$

where:
$APPR_{c \to v}$ is the output of a given check node;
$APPD_{y \to c}$, $y \in n_c - \{v\}$ are the messages received by the given check node.

14. An LDPC decoder comprising:
a plurality of check nodes and a plurality of variable nodes;
each of the check nodes functionally connected to receive a respective at least one LAPPR (logarithm a posteriori probability ratio) message from at least one variable node, each of the check nodes comprising processing circuitry that performs check node processing using the received at least one LAPPR message and outputs at a respective LAPPD (logarithm a posteriori probability difference) message to at least one variable node;
each of the variable nodes functionally connected to receive a respective at least one LAPPD message from at least one check node and to receive an intrinsic input, each of the variable nodes comprising variable node processing circuitry that performs variable node processing using the received at least one LAPPD message and the intrinsic inputs and outputs a respective LAPPR message to at least one check node
wherein the LDPC decoder is implemented using at least one of:
a first circuit for each variable node and a second circuit for each check node with physical interconnections between the nodes for message passing;
a processor with instructions to implement the functionality of the check nodes and the variable nodes.

15. The decoder of 14 wherein:
variable node processing is performed according to:

$$LAPPD_{v \to c}^{sgn} = \text{sign}\left(\tanh\left(\frac{m_0 + \sum_{h \in n_v - \{c\}} m_{h \to v}}{2}\right)\right) \quad (11)$$

$$LAPPD_{v \to c}^{mag} = \ln\left|\tanh\left(\frac{m_0 + \sum_{h \in n_v - \{c\}} m_{h \to v}}{2}\right)\right|$$

where:
$LAPPD_{v \to c}^{sgn}$ is the sign of the output of a given variable node;
$LAPPD_{v \to c}^{mag}$ is the magnitude of the output of a given variable node;
$m_0$ is an intrinsic input to a given variable node;
$m_{h \to v}$, $h \in n_v - \{c\}$ are the messages received by the given variable node;
check node processing is performed according to:

$$m_{c \to v} = \prod_{y \in n_c - \{v\}} LAPPD_{y \to c}^{sgn} \cdot 2\tanh^{-1}\exp\left(\sum_{y \in n_c - \{v\}} LAPPD_{y \to c}^{mag}\right). \quad (12)$$

where:
$m_{c \to v}$ is the output of a given check node;
$LAPPD_{y \to c}$, $y \in n_c - \{v\}$ are the messages received by the given check node.

16. A receiver comprising:
at least one antenna for receiving at least one input signal which is generated a set of intrinsic inputs;
at least one processor that performs LDPC decoding by:
performing variable node processing for each of a plurality of variable nodes using LAPPR inputs and the intrinsic inputs to produce an LAPPD output;
performing check node processing for each of a plurality of check nodes using LAPPD inputs to produce an LAPPR output;
the LAPPD outputs of the variable nodes being used as LAPPD inputs of the check nodes, and the LAPPR outputs of the check nodes being used as LAPPR inputs of the variable nodes;
repeating the performing variable node processing and performing check node processing until a stop criterion is satisfied;
outputting soft decisions or the hard decisions.

17. The receiver of claim 16 wherein outputting soft decisions or hard decisions comprises outputting hard decisions.

18. The receiver of claim 16 wherein:
variable node processing is performed according to:

$$LAPPD_{v \to c}^{sgn} = \text{sign}\left(\tanh\left(\frac{m_0 + \sum_{h \in n_v - \{c\}} m_{h \to v}}{2}\right)\right) \quad (11)$$

$$LAPPD_{v \to c}^{mag} = \ln\left|\tanh\left(\frac{m_0 + \sum_{h \in n_v - \{c\}} m_{h \to v}}{2}\right)\right|$$

where:
$LAPPD_{v \to c}^{sgn}$ is the sign of the output of a given variable node;
$LAPPD_{v \to c}^{mag}$ is the magnitude of the output of a given variable node;
$m_0$ is an intrinsic input to a given variable node;
$m_{h \to v}$, $h \in n_v - \{c\}$ are the messages received by the given variable node;
check node processing is performed according to:

$$m_{c \to v} = \prod_{y \in n_c - \{v\}} LAPPD_{y \to c}^{sgn} \cdot 2\tanh^{-1}\exp\left(\sum_{y \in n_c - \{v\}} LAPPD_{y \to c}^{mag}\right). \quad (12)$$

where:
$M_{c \to v}$ is the output of a given check node;
$LAPPD_{y \to c}$, $y \in n_c - \{v\}$ are the messages received by the given check node.

19. A method of performing LDPC decoding comprising:
receiving a set of intrinsic inputs;
performing variable node processing for each of a plurality of variable nodes using LAPPR inputs and the intrinsic inputs to produce an LAPPD output;
performing check node processing for each of a plurality of check nodes using LAPPD inputs to produce an LAPPR output;
the LAPPD outputs of the variable nodes being used as LAPPD inputs of the check nodes, and the LAPPR outputs of the check nodes being used as LAPPR inputs of the variable nodes;
repeating the performing variable node processing and performing check node processing until a stop criterion is satisfied;
outputting soft decisions or hard decisions.

20. The method of claim 19 wherein outputting soft decisions or hard decisions comprises outputting hard decisions.

21. The method of claim 19 wherein:
variable node processing is performed according to:

$$LAPPD_{v \to c}^{sgn} = \text{sign}\left(\tanh\left(\frac{m_0 + \sum_{h \in n_v - \{c\}} m_{h \to v}}{2}\right)\right) \quad (11)$$

$$LAPPD_{v \to c}^{mag} = \ln\left|\tanh\left(\frac{m_0 + \sum_{h \in n_v - \{c\}} m_{h \to v}}{2}\right)\right|$$

where:
LAPPD$_{v \to c}^{sgn}$ is the sign of the output of a given variable node;
LAPPD$_{v \to c}^{mag}$ is the magnitude of the output of a given variable node;
$m_0$ is an intrinsic input to a given variable node;
$m_{h \to v}$, h∈$n_v$-{c} are the messages received by the given variable node;
check node processing is performed according to:

$$m_{c \to v} = \prod_{y \in n_c - \{v\}} LAPPD_{y \to c}^{sgn} \cdot 2\tanh^{-1}\exp\left(\sum_{y \in n_c - \{v\}} LAPPD_{y \to c}^{mag}\right). \quad (12)$$

where:
$M_{c \to v}$ is the output of a given check node;
LAPPD$_{y \to c}$, y∈$n_c$-{v} are the messages received by the given check node.

22. The method of claim 19 wherein receiving a set of intrinsic inputs comprises:
receiving a signal over a physical communications medium and generating the intrinsic inputs from the signal.

23. A non-transitory computer readable medium having computer executable instructions stored thereon which when executed on a computer implement a method comprising:
performing variable node processing for each of a plurality of variable nodes using LAPPR inputs and a set of intrinsic inputs to produce an LAPPD output;
performing check node processing for each of a plurality of check nodes using LAPPD inputs to produce an LAPPR output;
the LAPPD outputs of the variable nodes being used as LAPPD inputs of the check nodes, and the LAPPR outputs of the check nodes being used as LAPPR inputs of the variable nodes;
repeating the performing variable node processing and performing check node processing until a stop criterion is satisfied;
making soft decisions or hard decisions.

24. The computer readable medium claim 23 wherein:
variable node processing is performed according to:

$$LAPPD_{v \to c}^{sgn} = \text{sign}\left(\tanh\left(\frac{m_0 + \sum_{h \in n_v - \{c\}} m_{h \to v}}{2}\right)\right) \quad (11)$$

$$LAPPD_{v \to c}^{mag} = \ln\left|\tanh\left(\frac{m_0 + \sum_{h \in n_v - \{c\}} m_{h \to v}}{2}\right)\right|$$

where:
LAPPD$_{v \to c}^{sgn}$ is the sign of the output of a given variable node;
LAPPD$_{v \to c}^{mag}$ is the magnitude of the output of a given variable node;
$m_0$ is an intrinsic input to a given variable node;
$m_{h \to v}$, h∈$n_v$-{c} are the messages received by the given variable node;
check node processing is performed according to:

$$m_{c \to v} = \prod_{y \in n_c - \{v\}} LAPPD_{y \to c}^{sgn} \cdot 2\tanh^{-1}\exp\left(\sum_{y \in n_c - \{v\}} LAPPD_{y \to c}^{mag}\right). \quad (12)$$

where:
$m_{c \to v}$ is the output of a given check node;
LAPPD$_{y \to c}$, y∈$n_c$-{v} are the messages received by the given check node.

* * * * *

UNITED STATES PATENT AND TRADEMARK OFFICE
CERTIFICATE OF CORRECTION

Page 1 of 1

PATENT NO.        : 8,464,126 B2
APPLICATION NO.   : 12/674492
DATED             : June 11, 2013
INVENTOR(S)       : Young G. Kim et al.

It is certified that error appears in the above-identified patent and that said Letters Patent is hereby corrected as shown below:

In the Claims

Column 14, Claim 18, Line 45, "$M_{c \rightarrow v}$ is the output of a given check node" should be -- $m_{c \rightarrow v}$ is the output of a given check node --

Column 15, Claim 21, Line 30, "$M_{c \rightarrow v}$ is the output of a given check node" should be -- $m_{c \rightarrow v}$ is the output of a given check node --

Signed and Sealed this
Fifteenth Day of July, 2014

Michelle K. Lee
*Deputy Director of the United States Patent and Trademark Office*